(12) United States Patent
Kohiki et al.

(10) Patent No.: US 8,721,864 B2
(45) Date of Patent: *May 13, 2014

(54) PROCESS AND APPARATUS FOR PRODUCING A METAL COVERED POLYIMIDE COMPOSITE

(75) Inventors: Michiya Kohiki, Ibaraki (JP); Naonori Michishita, Ibaraki (JP); Nobuhito Makino, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/365,429

(22) Filed: Feb. 3, 2012

(65) Prior Publication Data

US 2012/0132531 A1 May 31, 2012

Related U.S. Application Data

(62) Division of application No. 12/738,095, filed as application No. PCT/JP2008/066644 on Sep. 16, 2008.

(30) Foreign Application Priority Data

Oct. 18, 2007 (JP) .................................. 2007-270922

(51) Int. Cl.
| | |
|---|---|
| C25D 5/54 | (2006.01) |
| C25D 5/56 | (2006.01) |
| C25D 5/02 | (2006.01) |
| C25D 5/48 | (2006.01) |
| C23C 28/00 | (2006.01) |
| C23C 28/02 | (2006.01) |
| H01L 21/288 | (2006.01) |

(52) U.S. Cl.
USPC ........... 205/167; 205/164; 205/165; 205/166; 205/169; 205/183; 205/184; 205/186; 205/187; 205/118; 205/123; 205/125; 205/221

(58) Field of Classification Search
USPC ......... 205/164, 165, 166, 167, 169, 183, 184, 205/186, 187, 118, 123, 125, 221
See application file for complete search history.

(56) References Cited

U.S. PATENT DOCUMENTS 4,231,848 A 11/1980 Kawasumi et al.
5,112,462 A * 5/1992 Swisher ....................... 205/165
(Continued)

FOREIGN PATENT DOCUMENTS

JP 06-120630 A 4/1994
JP 06-210794 A 8/1994
(Continued)

Primary Examiner — Edna Wong
(74) Attorney, Agent, or Firm — Howson & Howson LLP (57) ABSTRACT

A metal covered polyimide composite comprising a tie-coat layer and a metal seed layer formed on a surface of a polyimide film by electroless plating or a drying method is provided. A copper layer or a copper alloy layer is formed thereon by electroplating. The copper plated layer or copper alloy plated layer includes three layers to one layer of the copper layer or copper alloy layer. The metal covered polyimide composite effectively prevents peeling in a non-adhesive flexible laminate (especially a two-layer flexible laminate), and more particularly, effectively inhibits peeling from the interface of a copper layer and tin plating. A method of producing the composite and apparatus for producing the composite are also provided.

9 Claims, 6 Drawing Sheets

(56) References Cited

U.S. PATENT DOCUMENTS

| | | | |
|---|---|---|---|
| 5,681,443 A * | 10/1997 | Ameen et al. | 205/125 |
| 6,103,135 A * | 8/2000 | Kusner et al. | 216/20 |
| 6,171,714 B1 * | 1/2001 | Bergkessel et al. | 428/618 |
| 6,638,642 B2 | 10/2003 | Kitano et al. | |
| 6,833,198 B2 | 12/2004 | Sakamoto et al. | |
| 6,835,241 B2 | 12/2004 | Tsuchida et al. | |
| 6,960,391 B2 | 11/2005 | Natsume et al. | |
| 7,341,796 B2 | 3/2008 | Hanafusa | |
| 2002/0182432 A1 | 12/2002 | Sakamoto et al. | |
| 2004/0084206 A1 | 5/2004 | Tung | |
| 2004/0209109 A1 | 10/2004 | Tsuchida et al. | |
| 2007/0145584 A1 | 6/2007 | Kataoka et al. | |
| 2009/0162685 A1 | 6/2009 | Kobayashi et al. | |
| 2009/0208762 A1 | 8/2009 | Akase | |
| 2010/0018273 A1 | 1/2010 | Sato | |
| 2010/0040873 A1 | 2/2010 | Kohiki et al. | |
| 2010/0051451 A1 | 3/2010 | Sato | |
| 2010/0221563 A1 * | 9/2010 | Kohiki et al. | 428/473.5 |

FOREIGN PATENT DOCUMENTS

| | | | | |
|---|---|---|---|---|
| JP | 11092579 A * | 4/1999 | | C08J 7/00 |
| JP | 2000-054188 A | 2/2000 | | |
| JP | 2002-252257 A | 9/2002 | | |
| JP | 2006-253185 A | 9/2006 | | |
| JP | 2006-316327 A | 11/2006 | | |
| JP | 2007-204848 A | 8/2007 | | |
| JP | 2007-214519 A | 8/2007 | | |
| JP | 2007204848 A * | 8/2007 | | C25D 21/12 |
| JP | 2007214519 A * | 8/2007 | | H01L 21/60 |
| JP | 2007-246962 A | 9/2007 | | |
| WO | 2006/059825 A1 | 6/2006 | | |

* cited by examiner

PROCESS AND APPARATUS FOR PRODUCING A METAL COVERED POLYIMIDE COMPOSITE

CROSS REFERENCE TO RELATED APPLICATIONS

This application is a divisional of co-pending U.S. application Ser. No. 12/738,095 which is the National Stage of International Application No. PCT/JP2008/066644, filed Sep. 16, 2008, which claims the benefit under 35 USC 119 of Japanese Application No. 2007-270922, filed Oct. 18, 2007.

BACKGROUND

The present invention relates to a metal covered polyimide composite for use as a mounting material of electronic components such as a flexible print substrate, TAB, COF (Chip on Film), and additionally relates to a method of producing the composite and an apparatus for producing the composite.

An FCCL (Flexible Copper Clad Laminate), in which metal conductor layers primarily formed from copper are laminated on a polyimide film, is broadly used as a circuit board material in the electronics industry. Among the above, a non-adhesive flexible laminate (especially a two-layer flexible laminate) that does not include an adhesive layer between a polyimide film and a metal layer is catching attention on the demands of finer pitches of the circuit wiring width.

As a method of producing a non-adhesive flexible laminate, in particular a non-adhesive flexible laminate capable of accommodating fine pitches, primarily performed is a so-called metalizing method of forming, in advance, a tie-coat layer configured from a material having favorable adhesion with polyimide on a polyimide film by a drying method such as sputtering, CVD, or vapor deposition and a metal seed layer as a conductor of the cathode/current in the subsequent electroplating process, and thereafter forming a metal layer film to become the conductor layer of the circuit board by way of electroplating (refer to U.S. Pat. No. 3,258,296).

In this metalizing method, for better adhesion strength between the metal layer and the polyimide film, modification is carried out by performing plasma treatment to the polyimide film surface in order to eliminate the contaminants on the surface and to improve the surface roughness prior to forming the metal layer (refer to U.S. Pat. No. 3,173,511 and PCT International Application Publication No. WO 2003-519901).

Generally, when pre-forming a metal layer on a polyimide film by a drying method such as sputtering, the improvement of adhesion and etching properties is being sought through the selection of the interlayer material (refer to Japanese Patent Laid-Open Publication No. H6-120630).

In addition, proposed is a polyimide film with a metal film for use in TAB or FPC obtained by performing chemical etching to the polyimide film surface so to roughen the surface, forming a foundation layer thereon, and additionally forming a copper vapor deposition layer thereon (refer to Japanese Patent Laid-Open Publication No. H6-210794).

When a metal covered polyimide composite is to be used as a mounting material of electronic components such as a COF (Chip on Film), the metal layer on the polyimide is partially eliminated to create a circuit pattern, tin plating is subsequently performed on the copper layer forming the circuit pattern, and treatment such as solder resist or resin seal is additionally performed on the tin plated layer. However, a problem in that this tin plated layer may peel occurs. A major cause of such peeling is the Kirkendall voids (air gaps) that are generated between the copper layer and the tin plated layer due to the electroplating process. The Kirkendall voids will be explained in detail later. An electroplated copper layer is usually formed with a plurality of electrolytic baths, and the electroplating current conditions of the copper layer will change considerably among the electrolytic baths as a matter of course. The portions in which the electroplating current conditions change considerably will become boundaries in the copper plated layer since the intake of copper crystal grains, impurities and the like will differ from the other portions. Since the Kirkendall voids particularly occur at the portions where the copper plated layer boundary and the tin plated layer are adjacent to each other, if plating is to be performed in multiple electroplating baths, then the Kirkendall voids will arise at least in a quantity that is equivalent to the number of electroplating baths.

As a method of overcoming the foregoing problem, proposed is a method of forming a copper layer from the surface layer to an area that is at least three times the tin plated layer using the same electrolytic bath in a copper plating film to be formed using a plurality of electrolytic baths (refer to Japanese Patent Laid-Open Publication No. 2007-214519). Japanese Patent Laid-Open Publication No. 2007-214519 has analyzed that the Kirkendall voids causes the peeling.

Nevertheless, in the foregoing case, Japanese Patent Laid-Open Publication No. 2007-214519 only sees the tin covered on the uppermost layer of the copper plating as the problem. However, when forming a copper circuit and covering it with a tin layer, the tin layer will cover the side face in addition to the uppermost layer of the copper. In addition, as described later, since a copper layer boundary may occur even with the same electrolytic bath, it cannot be said that the foregoing method is a sufficient solution to the problem.

Accordingly, the problem of Kirkendall voids arising in the bonded interface of the multiple copper layers (nine layers in the Examples of Japanese Patent Laid-Open Publication No. 2007-214519) and the tin layer has not been resolved. In addition, with a copper layer in which only the uppermost layer is thick, the other copper layers must be made thin by just that much, and there is a problem in that the balance of the copper layers will be lost.

In light of the above, a zigzag-type electroplating process that requires numerous electroplating baths is undesirable, and it is preferable to reduce the number of electroplating baths as much as possible. In order to obtain a plated copper layer of the intended thickness with few electroplating baths, it is necessary to raise the plating current density, and in this respect a drum electroplating method is effective. The drum electroplating method is a method of feeding a polyimide film, in which a tie-coat layer and a metal seed layer are formed thereon by electroless plating or a drying method, around a drum surface that is dipped in an electrolyzer, and thereby performing copper plating to the surface. Since this method is able to move the anode and cathode closer without disturbances such as the warping or blurring during the feeding of the film to become the cathode and to control the distance constant between the anode and cathode, it is possible to increase the current density. Moreover, as a result of moving the anode and cathode closer together, the flow velocity of the plating electrolytic solution can also be increased easily, and this is also effective in increasing the current density. Accordingly, the drum electroplating method is effective in decreasing the Kirkendall voids.

Nevertheless, this drum electroplating method also entails its own problems. It is necessary to increase the current density in order to increase the electrodeposition rate of the electroplating process. However, at the initial stage of starting the electroplating process, the metal seed layer formed on the polyimide surface is unable to withstand a large current since its thickness is limited. Consequently, the anodes that set to face the drum are divided into a plurality of zones (plating zones), and the current density to the respective zones is being controlled independently.

As a result, each time the amount of feed (amount of current) to the anode changes, a different copper plated layer is formed, and the Kirkendall voids will arise at the copper plated layer boundary. Conventionally, in consideration of the production efficiency, a feeding method of disposing numerous anodes and dividing the zone into four zones or more is being adopted, and, as a result, the number of copper layers will be four or more.

In addition, when feeding the plating material around the drum and performing plating upon providing anodes at the opposing position, a proposal has been made of making the space between one anode and the plating drum to be different for each plating area, or disposing a differently sized mesh between the anode and the plating drum (refer to Japanese Patent Laid-Open Publication No. 2007-204848). It may appear that the generation of the Kirkendall voids can be inhibited as a result of reducing the number of plating baths.

However, this idea is unrealistic since it merely proposes the use of one anode because the control of the current density for each anode is troublesome. In other words, besides the supply method being unclear, the flow velocity of the plating solution will be disturbed and it will not be possible to ensure a uniform flow velocity if mesh or the like is disposed, regardless of the supply method that is adopted. Specifically, with U.S. Pat. No. 3,258,296, mesh or the like will become an impediment whereby the flow velocity of the plating solution cannot be controlled, and it will be difficult to ensure the uniformity of the amount of electrodeposition in a direction that is parallel to the rotational axis of the drum. Aside from the problem of Kirkendall voids, this idea relates to the problem of plating uniformity, and it could be said that it is an unrealistic method. In addition, this technology fails to even recognize the problem of Kirkendall voids.

Accordingly, it could be said that the conventional technologies fail to teach a fundamental solution to the problem of Kirkendall voids that arise between the copper layer and the tin layer.

SUMMARY

Thus, an object of the present invention is to provide a metal covered polyimide composite which can effectively prevent peeling in a non-adhesive flexible laminate (especially a two-layer flexible laminate), and particularly can effectively inhibit peeling from the interface of a copper layer and a tin plating, as well as provide a method of producing the composite and an apparatus for producing the composite.

In order to achieve the foregoing object, the present invention provides a metal covered polyimide composite comprising a tie-coat layer and a metal seed layer formed on a surface of a polyimide film by electroless plating or a drying method, and a copper layer or a copper alloy layer formed thereon by electroplating, wherein the copper plated layer or copper alloy plated layer includes three layers to one layer of the copper layer or copper alloy layer. The tie-coat layer may be nickel, chromium, cobalt, nickel alloy, chromium alloy, or cobalt alloy, and the metal seed layer may be copper or copper alloy.

The present invention additionally provides a method of producing a metal covered polyimide composite, wherein a tie-coat layer and a metal seed layer on a surface of a polyimide film by electroless plating or a drying method, three layers to one layer of an electroplated layer of copper or copper alloy are additionally formed thereon. After forming the tie-coat layer and the metal seed layer on a surface of a polyimide film by electroless plating or a drying method, the electroplated layer of copper or copper alloy may be formed by dividing an electroplating zone into one to four zones when feeding the polyimide film with the tie-coat layer and metal seed layer formed thereon around a plating drum and performing electroplating thereto. After forming a copper circuit or copper alloy circuit by way of etching, tin plating to the copper circuit or copper alloy circuit can be performed. The electroplating can be performed in one or two baths.

The present invention further provides an apparatus for producing a metal covered polyimide composite comprising an electroplating bath, a plating drum in which a part thereof is dipped in the electroplating bath, a unit for feeding a polyimide film to be plated, in which a tie-coat layer and a metal seed layer are formed on its surface by electroless plating or a drying method, around the plating drum, and a unit for supplying current to the plated surface of the polyimide film with the tie-coat layer and metal seed layer formed thereon, wherein one or more anodes are set to face the drum, and the plating zone is divided into one to four zones. Two electroplating baths may be used, and the plating zone may be divided into two to four zones. Alternatively, one electroplating bath may be used, and the plating zone can be divided into one or two zones.

As a result of the above, a metal covered polyimide composite, a method of producing the composite and an apparatus for producing the composite of the present invention can effectively prevent peeling in a non-adhesive flexible laminate (especially a two-layer flexible laminate), particularly can effectively inhibit peeling from the interface of a copper layer and a tin plating, and yield a superior effect of being able to improve the adhesion strength.

DETAILED DESCRIPTION

Specific examples of the present invention are now explained. The ensuing explanation is provided to facilitate the understanding of this invention, and the present invention shall in no way be limited thereby. In other words, various modifications and other embodiments shall be included in the present invention as a matter of course.

Incidentally, the present invention includes cases of copper alloy plating in addition to copper plating, but in order to simplify the explanation these will be collectively explained as copper plating. Here, this shall also include copper alloy plating.

The basic process is to form a metal layer on at least one face of the polyimide film by the sputtering method, and additionally form a metal conductor layer formed from a copper layer or copper alloy layer on the foregoing surface in order to prepare a non-adhesive flexible laminate.

Foremost, the polyimide film surface is subject to plasma treatment in order to eliminate the contaminants on the surface and modify the surface.

Subsequently, a sputtered metal layer (so-called tie-coat layer) of 5 to 300 nm is formed on the surface of the polyimide film. Generally, the sputtered metal layer is selected from one type among nickel, chromium, cobalt, nickel alloy, chromium alloy, and cobalt alloy. Generally speaking, a polyimide film having a thickness of 12.5 µm to 50 µm can be used, but this thickness is required to the circuit board, and there is no particular limitation regarding the thickness. Generally, Upilex by Ube Industries, Kapton by DuPont-Toray, Apical by Kaneka or the like is used, but there is also no particular limitation regarding the type of polyimide film to be used.

The tie-coat layer has the function of increasing the adhesive strength between the metal layer and the polyimide [film], and increasing the stability under a heat-resistant and moisture-resistant environment.

Subsequently, a copper layer of 150 to 500 nm to become the metal seed layer is formed on the tie-coat layer by sputtering. The sputtered copper layer will become the conductor of the cathode/current in the subsequent electroplating process.

Figure 1:
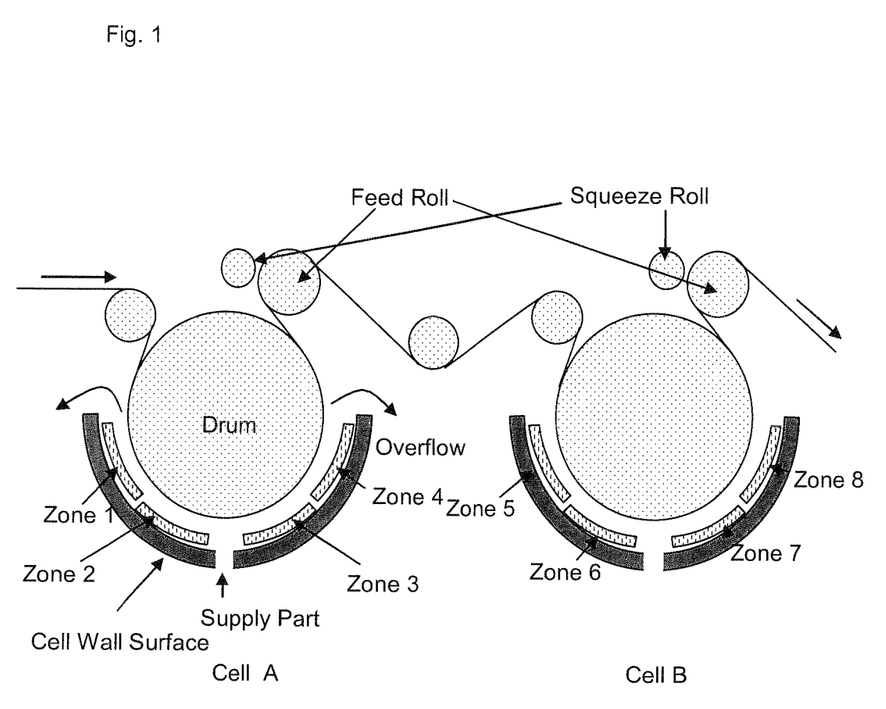
FIG. 1 is a schematic explanatory diagram of a drum-based two bath-type electroplating apparatus.

Subsequently, an electroplated layer formed from copper or copper alloy is formed on the metal seed layer. As the plating system, the electroplating apparatus shown in FIG. 1 is used.

This electroplating apparatus comprises an electroplating bath, a plating drum in which a part thereof (approximately half) is dipped in the electroplating bath, a unit for feeding a polyimide film plated around the plating drum, a unit for supplying current to the plated surface of the polyimide film, and one or more anodes facing the drum. As one mode, these anodes are so-called insoluble anodes, and the supply of copper ions for copper plating is performed by supplying an electrolytic solution, in which copper is separately dissolved and in which the copper concentration is adjusted, to the electrolytic bath.

The copper or copper alloy plating system that is used in the present invention is a one or two bath-type plating system. In the case of a two bath-type plating system, Cell A (a bath) has zones 1 to 4 and Cell B (the other bath) similarly has zones 5 to 8. It should be easy to understand that the one bath-type plating system only has Cell A. Conventionally, in order to value the plating efficiency, even in the case of using two baths, the number of zones was increased and four or more plated layers were used. Anodes are set to face the drum for each of these zones. The solution sending method where the electroplating solution is supplied from the lower part of the electroplating bath and overflows from the upper part of the electroplating bath is adopted. This supply method is able to control the flow velocity and is necessary to form a uniform plated layer. Moreover, the current of each anode zone can be adjusted independently.

At the initial stages of plating using the foregoing two bath-type plating system; that is, at zone 1 and zone 2, the copper or copper alloy plating to the sputtered metal layer is hardly performed, and only a slight amount of plating is formed. In addition, the same applies to Cell B, and the plating material that was once exposed to the atmosphere is hardly plated at first; that is, the plating is not formed even in the initial feeding at zones 5 and 6. Accordingly, with this kind of two bath-type electroplating apparatus, plating is performed at zones 3 and 4 and at zones 7 and 8.

Conventionally, a plating method of arranging numerous plating baths in parallel and repeatedly dipping a continuously wound polyimide film in a plating bath was adopted. In many cases, a copper plated layer was conventionally formed according to the foregoing method. Based on this method, since there is no limit in the number of plating baths, plating can be performed to multiple layers as many as plating baths.

With this kind of zigzag-type plating method, the retention time in each plating bath is short. Thus, in order to achieve a prescribed thickness, ten or more plated layers are usually formed (refer to foregoing Japanese Patent Laid-Open Publication No. 2007-214519).

With electronic components such as a COF (Chip on Film), the copper layer of the metal covered polyimide composite obtained as described above is etched with an etching solution to form a conductive circuit. Then, tin plating is formed on the copper circuit and solder resist, resin or the like is used additionally to cover the same. In the foregoing case, peeling between the copper circuit layer and tin plated layer and cracks in the tin layer will become a problem.

These problems are considered to be caused by the Kirkendall voids explained above. By observing the locations where peeling occurred between the copper circuit layer and tin plated layer, air gaps were observed. Since this tin layer is formed on the side face of the circuit in addition to the upper surface of the copper circuit, this is a problem that cannot be solved with only the upper surface of the copper circuit.

Since numerous crystal grain boundaries and impurities exist in the vicinity of the copper plated layer boundary, it is considered that the lattice arrangement of copper crystals is incomplete. Since such incomplete lattice arrangement will considerably accelerate the diffusion of copper, the diffusion rate of copper considerably exceeds that of tin in the mutual diffusion of copper and tin in the vicinity of the copper plated layer boundary and copper will be deficient in the vicinity of said boundary. Thus, numerous atomic vacancies will arise in the vicinity of the copper plated layer boundary after the copper is diffused. These atomic vacancies are trapped in the portions where the lattice arrangement is incomplete in the vicinity of the copper plated layer boundary, and the air gaps assembled thereby are the Kirkendall voids.

Although it is considered that the Kirkendall voids do not arise easily at room temperature, diffusion will advance due to the foregoing mechanism, and the Kirkendall voids are generated thereby during the heat treatment at roughly 80 to 150° C. after the tin plating, and the heat treatment at roughly 150 to 160° C. in the processes of solder resist, resin seal and the like. The foregoing heat treatment processes are indispensible in producing wiring boards, and it can be said that this is an unavoidable problem so as long as discontinuous portions of the interface exists. In fact, at the locations where the Kirkendall voids occur; that is, at the discontinuous plating boundary, a phenomenon has been observed where the existence of fine crystal grains and the concentration of C, O, S and H, which are considered to be due to the additives added during the plating process, are higher in comparison to the continuously plated portions, and this verifies the mechanism in which the Kirkendall voids are generated. Hardly any generation of the Kirkendall voids is acknowledged in the continuously plated section of the copper layer, which is described later.

Therefore, the fewer the number of copper layers; that is, the number of copper layer boundaries, the fewer the Kirkendall voids. In this respect, with the drum-based two-bath copper plating system, if a once-plated surface is exposed to the atmosphere and additionally plated again, a copper layer boundary (discontinuous layer) will be formed. Thus, with a drum-based two-bath plating system, it is difficult to completely inhibit the Kirkendall voids.

Nevertheless, just because the Kirkendall voids are generated, it does not necessarily mean that they will all cause cracks in the tin layer or peeling, and what is important is how to reduce the amount of Kirkendall voids as much as possible upon efficiently forming a copper plated layer.

Moreover, with the foregoing zigzag-type plating system, since the Kirkendall voids will occur as many as, or more than the number of baths (ten layers or more), it could be said that this is clearly undesirable.

In light of the above, the present invention provides an apparatus for producing a metal covered polyimide composite in a drum plating system comprising an electroplating bath, a plating drum in which a part thereof (approximately half) is dipped in the electroplating bath, a unit for feeding a polyimide film to be plated around the plating drum, a unit for supplying current to the plated surface of the polyimide film, and one or more anodes facing the drum, wherein the plating zone is divided into three zones to one zone, and the copper layer or copper alloy layer is formed as three layers to one layer. The present invention additionally provides a method and apparatus for producing a metal covered polyimide composite in which the number of boundaries between the respective copper layers or copper alloy layers is two to zero.

Incidentally, in the foregoing case, in order to efficiently perform the plating, the distance L between zone 3 and zone 4 (or distance L between zone 7 and zone 8) is adjusted to be preferably double or less than the distance d between the anode and the plating object, and more preferably ½ or less.

It is thereby possible to reduce the discontinuous interface of the tin-plated copper layer and the tin layer as much as possible, and inhibit the generation of the Kirkendall voids.

In addition, desirably, the number of copper or copper alloy electroplating baths is few as possible, which is because an unavoidable discontinuous interface will occur as described. Thus, the use of one or two baths would be a desirable condition.

EXAMPLES

The Examples and Comparative Examples of the present invention are now explained.

These Examples are merely illustrative, and the present invention shall in no way be limited thereby. In other words, various modifications and other embodiments based on the technical spirit claimed in the claims shall be included in the present invention as a matter of course.

Example 1

There is no particular limitation in the material used as the polyimide film. For instance, Upilex by Ube Industries, Kapton by DuPont-Toray, and Apical by Kaneka are commercially available, and any one of these polyimide films can be applied in the present invention. The present invention is not limited to this kind of specific variety. In the Examples and Comparative Examples Upilex-SGA by Ube Industries is used as the polyimide film.

Foremost, the polyimide film was placed in a vacuum apparatus and, after evacuation; the polyimide film was subject to surface modification treatment using plasma.

Next, a tie-coat layer (Ni-20 wt % Cr) of 25 nm was formed on the foregoing polyimide film surface subject to the plasma treatment by way of sputtering. Subsequently, a metal seed layer (copper layer) of 300 nm was formed by sputtering. This can also be formed by electroless plating, but sputtering was performed in the Examples.

Then, the drum-based two bath-type electroplating apparatus shown in FIG. 1 was used to form a metal conductor layer (total thickness of approximately 8 μm) formed of copper on the surface of the foregoing metal seed layer by way of electroplating using a copper sulfate plating bath, whereby a two-layer flexible laminate was prepared. In the foregoing case, in order to reduce the number of zones, in Cell A, the anodes in zone 3 and zone 4 were electrically connected, and the distance L between zone 3 and zone 4 was adjusted to be approximately ½ of the distance d between the anode and the plating object in order to form the copper plated layer.

As a result of forming the copper layer, as described above, only a slight plated layer was formed in zone 1 and zone 2 of Cell A. Moreover, no plated layer was formed in zone 5 and zone 6 of Cell B. The copper layer was mainly formed in zone 3+zone 4, zone 7, and zone 8. The results are shown in Table 1.

As shown in Table 1, a copper plated layer of 3.90 μm was formed in zone 3+zone 4, that of 2.07 μm in zone 7, and that of 2.20 μm in zone 8. By way of reference, a copper plated layer of 0.05 μm was formed in zone 1, that of 0.27 μm in zone 2, and that of 0 μm in zone 5 and zone 6, respectively.

TABLE 1

| Zone | 1 | 2 | 3 + 4 | 5 | 6 | 7 | 8 |
|---|---|---|---|---|---|---|---|
| Thickness | 0.05 | 0.27 | 3.90 | 0.00 | 0.00 | 2.07 | 2.20 |

Thickness: Plating thickness (μm) per zone

The cross section of the copper layer obtained as described above is shown in FIG. 2, which is a result of performing chemical polishing of dipping the copper layer for 15 seconds in an aqueous solution of $NH_3$: 29%, $H_2O_2$: 1%.

Figure 2:
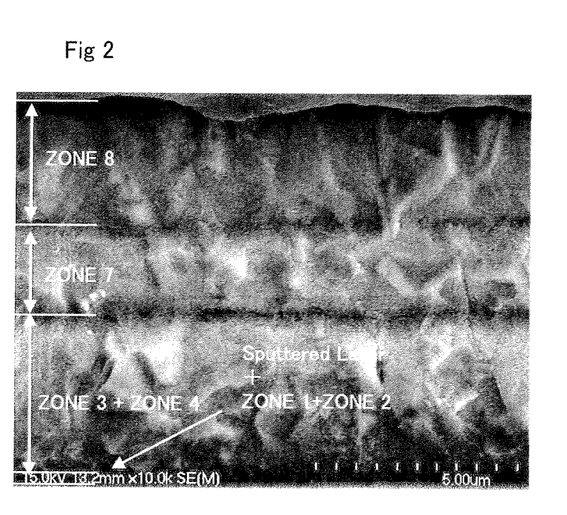
FIG. 2 is a micrograph of a copper foil cross section on a polyimide layer comprising the three copper layers shown in Example 1.

In zone 3+zone 4, the thickness of the copper layer was approximately two zones' worth, and the thickness of the copper layers formed in other zone 7+zone 8 has hardly any difference, so it is evident that a uniform layer was formed.

Between Cell A and Cell B, that is, zones 3+4 and zone 7, only a normal plating interface was observed, and no prominent boundary layer could be observed.

Subsequently, this copper layer was etched to form a circuit, and a tin plated layer of approximately 0.3 μm was additionally formed on the copper circuit by dipping it into a tin plating bath of AT-501 manufactured by Nikko Mining & Metals at 50° C. for 3 minutes. After the foregoing tin plating, the copper layer was annealed at 120° C.×12 hours, and the cross section was observed. This cross section is similarly a result of performing chemical polishing of dipping the copper layer for 15 seconds in an aqueous solution of $NH_3$: 29%, $H_2O_2$: 1%. The results are shown in FIG. 3.

Figure 3:
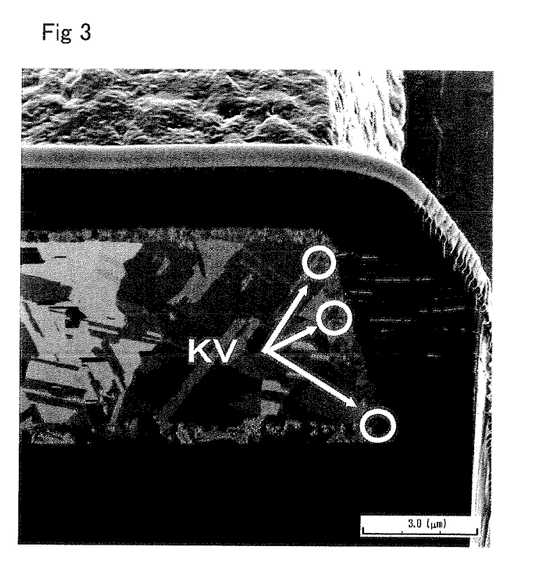
FIG. 3 is a micrograph showing the cross section of a boundary obtained by forming a circuit by etching the three plated copper layers of Example 1, subsequently forming a tin plated layer on the copper circuit, and performing annealing after the tin plating.

As shown in FIG. 3, (two) small Kirkendall voids (KV) were confirmed at the boundary sections of the respective layers (three layers). There were no Kirkendall voids immediately above the copper layer.

It is evident that the present invention is far superior to the conventional technologies where the number of abundant Kirkendall voids that arise in the ten copper layers (at least at the interface of the ten layers) is considerably high.

Example 2

Next, as with Example 1, the drum-based two bath-type electroplating apparatus shown in FIG. 1 was used to form the copper plated layer wherein, in order to reduce the number of zones, in Cell A, zone 3 and zone 4 were electrically connected, and the distance L between zone 3 and zone 4 was adjusted to be approximately ½ of the distance d between the anode and the plating object in order to form the copper plated layer; and, in Cell B, zone 7 and zone 8 were electrically connected, and the distance L between zone 7 and zone 8 was adjusted to be approximately ½ of the distance d between the anode and the plating object.

As a result of forming the copper layer, as described above, only a slight plated layer was formed in zone 1 and zone 2 of Cell A. Moreover, no plated layer was formed in zone 5 and zone 6 of Cell B. The results were the same as Example 1.

Consequently, the copper layer was mainly formed in zone 3, zone 4, and zone 7+zone 8. The results are shown in Table 2. As shown in Table 2, a copper plated layer of 3.90 μm was formed in zone 3+zone 4, and that of 4.27 μm in zone 7+zone 8. By way of reference, a copper plated layer of 0.05 μm was formed in zone 1, that of 0.27 μm in zone 2, and that of 0 μm in zone 5 and zone 6, respectively.

TABLE 2

| Zone | 1 | 2 | 3 + 4 | 5 | 6 | 7 + 8 |
|---|---|---|---|---|---|---|
| Thickness | 0.05 | 0.27 | 3.90 | 0.00 | 0.00 | 4.27 |

Thickness: Plating thickness (μm) per zone

The cross section of the copper layer obtained as described above is shown in FIG. 4, which is a result of performing chemical polishing of dipping the copper layer for 15 seconds in an aqueous solution of $NH_3$: 29%, $H_2O_2$: 1%.

Figure 4:
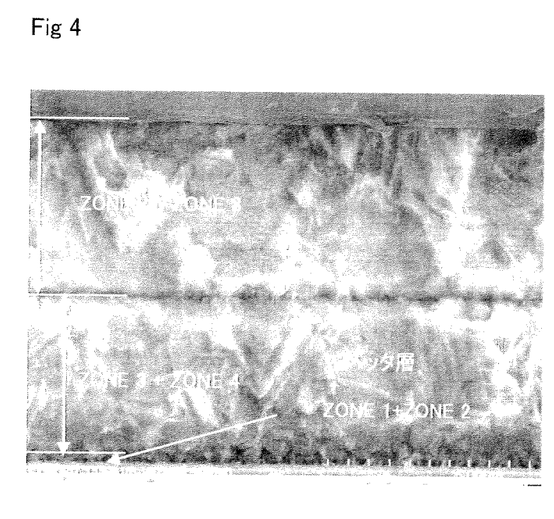
FIG. 4 is a micrograph of the copper foil cross section on the polyimide layer comprising the two copper layers shown in Example 2.

In zone 3+zone 4, the thickness of the copper layer was approximately two zones' worth, and so was the thickness of the copper layers formed in other zone 7+zone 8, but the thickness of the copper layers has hardly any difference, so it is evident that a uniform layer was formed. Between Cell A and Cell B, that is, zones 3+4 and zone 7+8, only a normal plating interface was observed, and no prominent boundary layer could be observed.

Figure 5:
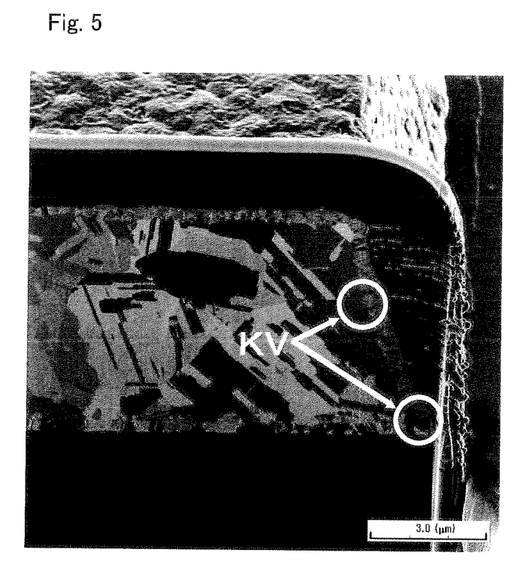
FIG. 5 is a micrograph showing the cross section of a boundary obtained by forming a circuit by etching the two plated copper layers of Example 2, subsequently forming a tin plated layer on the copper circuit, and performing annealing after the tin plating.

Subsequently, this copper layer was etched to form a circuit, and a tin plated layer of approximately 0.3 μm was additionally formed on the copper circuit by dipping it into a tin plating bath of AT-501 manufactured by Nikko Mining & Metals at 50° C. for 3 minutes. After the foregoing tin plating, the copper layer was annealed at 120° C.×12 hours, and the cross section was observed. This cross section is similarly a result of performing chemical polishing of dipping the copper layer for 15 seconds in an aqueous solution of $NH_3$: 29%, $H_2O_2$: 1%.

The results are shown in FIG. 5. As shown in FIG. 5, (one) small Kirkendall void (KV) was confirmed at the boundary section of the respective layers (two layers), and another (one) was confirmed at the lower part (boundary section with the metal seed layer). There were no Kirkendall voids immediately above the copper layer.

It is evident that the present invention is far superior to the conventional technologies where the number of abundant Kirkendall voids that arise in the ten copper layers (at least at the interface of the ten layers) is considerably high. In addition, in comparison to Example 1, the number of Kirkendall voids was reduced even further since the discontinuous layer of the copper plated layer was reduced.

Example 3

Next, in addition to the plating conditions of Example 2, the copper plated layer was formed upon turning off the current of zone 1 and zone 2. In turning off the current of zone 1 and zone 2, dummy anodes prepared with an insulating material in the same shape was disposed in place of the normal anodes in zone 1 and zone 2.

As a result of forming the copper layer, in Cell A, a plated layer was not formed in zone 1 and zone 2. In addition, in Cell B also, a plated layer was not formed in zone 5 and zone 6.

Consequently, a copper layer was formed in zone 3+zone 4, and zone 7+zone 8. The results are shown in Table 3. As shown in Table 3, a copper plated layer of 4.25 μm was formed in zone 3+zone 4, and that of 4.25 μm in zone 7+zone 8. By way of reference, it was 0 μm in zone 1 and zone 2 and 0 μm in zone 5 and zone 6.

TABLE 3

| Zone | 1 | 2 | 3 + 4 | 5 | 6 | 7 + 8 |
|---|---|---|---|---|---|---|
| Thickness | 0.00 | 0.00 | 4.25 | 0.00 | 0.00 | 4.25 |

Thickness: Plating thickness (μm) per zone

The cross section of the copper layer obtained as described above is shown in FIG. 6, which is a result of performing chemical polishing of dipping the copper layer for 15 seconds in an aqueous solution of $NH_3$: 29%, $H_2O_2$: 1%.

Figure 6:
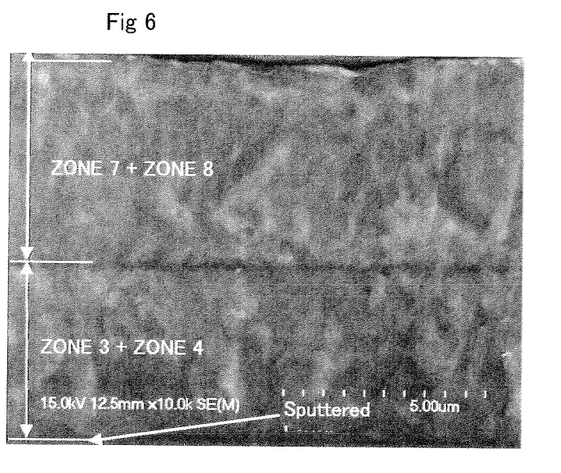
FIG. 6 is a micrograph of the copper foil cross section on the polyimide layer comprising the one copper layer shown in Example 3.

In zone 3+zone 4, the thickness of the copper layer was approximately two zones' worth, and so was the thickness of the copper layers formed in other zone 7+zone 8, but the thickness of the copper layers has hardly any difference, so it is evident that a uniform layer was formed. Between Cell A and Cell B, that is, zones 3+4 and zone 7+8, only a normal plating interface was observed, and no prominent boundary layer could be observed.

Figure 7:
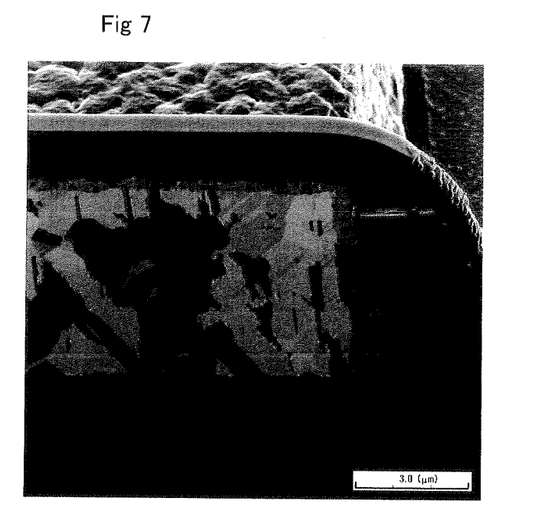
FIG. 7 is a micrograph showing the cross section of a boundary obtained by forming a circuit by etching the two plated copper layers of Example 3, subsequently forming a tin plated layer on the copper circuit, and performing annealing after the tin plating.

Subsequently, this copper layer was etched to form a circuit, and a tin plated layer of approximately 0.3 μm was additionally formed on the copper circuit by dipping it into a tin plating bath of AT-501 manufactured by Nikko Mining & Metals at 50° C. for 3 minutes. After the foregoing tin plating, the copper layer was annealed at 120° C.×12 hours, and the cross section was observed. This cross section is similarly a result of performing chemical polishing of dipping the copper layer for 15 seconds in an aqueous solution of $NH_3$: 29%, $H_2O_2$: 1%.

The results are shown in FIG. 7. As shown in FIG. 7, no Kirkendall voids were observed at the boundary section of the respective layers (two layers), at the lower part (boundary section with the metal seed layer), or immediately above the copper layer. It is evident that the present invention is far superior to the conventional technologies where the number of abundant Kirkendall voids that arise in the ten copper layers (at least at the interface of the ten layers) is considerably high. In addition, in comparison to Example 2, the number of Kirkendall voids was reduced even further since the discontinuous layer of the copper plated layer was reduced.

Example 4

Next, a drum-based one bath-type electroplating apparatus was used and a copper plated layer was formed with only one cell and with only one zone in order to reduce the number of zones. Specifically, there is only one copper layer.

Figure 8:
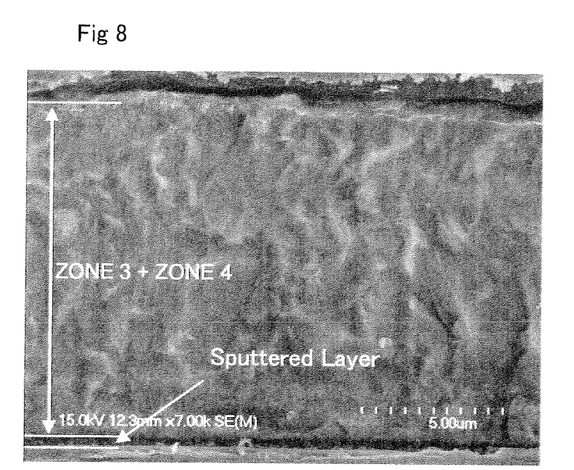
FIG. 8 is a micrograph of the copper foil cross section on the polyimide layer comprising the one copper layer shown in Example 4.

Consequently, the copper layer was formed in one zone. The results are shown in Table 4. As shown in Table 4, a copper plated layer of 8.50 μm was formed in one zone. The cross section of the copper layer obtained as described above is shown in FIG. 8, which is a result of performing chemical polishing of dipping the copper layer for 15 seconds in an aqueous solution of $NH_3$: 29%, $H_2O_2$: 1%.

TABLE 4

| Zone | 1 | 2 | 3 + 4 | 5 | 6 | 7 | 8 |
|---|---|---|---|---|---|---|---|
| Thickness | 0.00 | 0.00 | 8.50 | 0.00 | 0.00 | 0.00 | 0.00 |

Thickness: Plating thickness (μm) per zone

Figure 9:
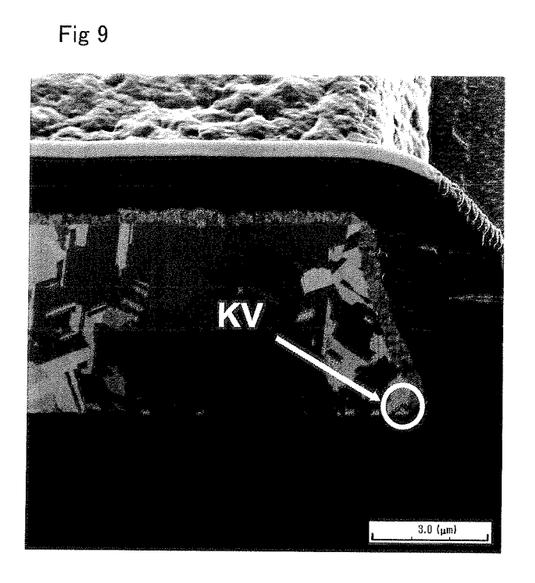
FIG. 9 is a micrograph showing the cross section of a boundary obtained by forming a circuit by etching the one plated copper layer of Example 4, subsequently forming a tin plated layer on the copper circuit, and performing annealing after the tin plating.

Subsequently, this copper layer was etched to form a circuit, and a tin plated layer of approximately 0.3 μm was additionally formed on the copper circuit by dipping it into a tin plating bath of AT-501 manufactured by Nikko Mining & Metals at 50° C. for 3 minutes. After the foregoing tin plating, the copper layer was annealed at 125° C.×10.5 hours, and the cross section was observed. This cross section is similarly a result of performing chemical polishing of dipping the copper layer for 15 seconds in an aqueous solution of $NH_3$: 29%, $H_2O_2$: 1%.

The results are shown in FIG. 9. As shown in FIG. 9, only one small Kirkendall void (KV) was confirmed at the lower part (boundary section with the metal seed layer), and there were no Kirkendall voids immediately above the copper layer.

It is evident that the present invention is far superior to the conventional technologies where the number of abundant Kirkendall voids that arise in the ten copper layers (at least at the interface of the ten layers) is considerably high. In addition, in comparison to Example 1, the number of Kirkendall voids was reduced even further since the discontinuous layer of the copper plated layer was reduced.

Comparative Example 1

Next, a polyimide film was continuously introduced into conventional ten copper plating baths, and ten copper layers were formed on the surface of the polyimide film in a zigzag. As with Example 1, the observation of the Kirkendall voids are shown. In the foregoing case, the average thickness of one layer was approximately 0.5 μm, and a copper layer of approximately 8 μm was formed as the ten copper plated layers.

Figure 10:
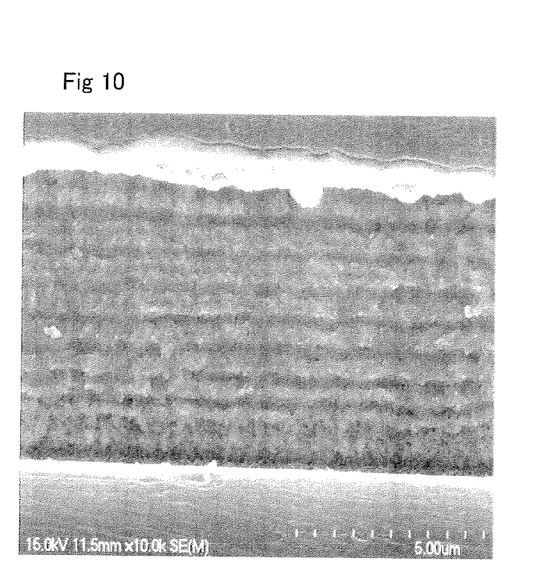
FIG. 10 a micrograph of the cross section of the ten copper plated layers shown in Comparative Example 1.

The cross section of the copper layer obtained as described above is shown in FIG. 10, which is a result of performing chemical polishing of dipping the copper layer for 15 seconds in an aqueous solution of $NH_3$: 29%, $H_2O_2$: 1%. The other conditions were the same as Example 1.

Figure 11:
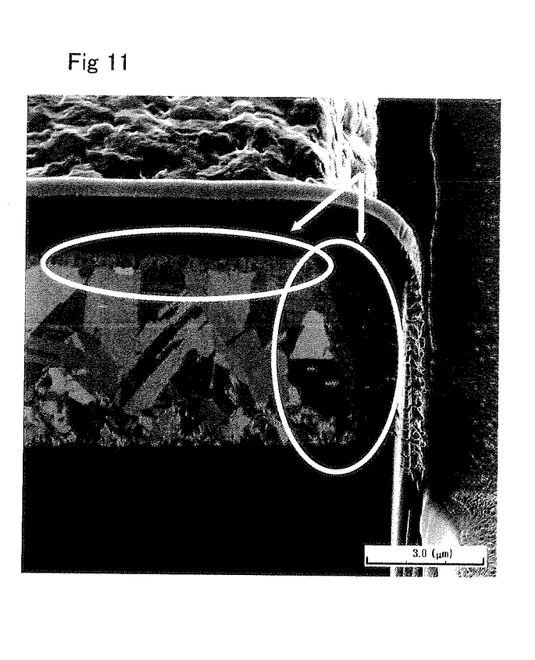
FIG. 11 is a micrograph showing the cross section of a boundary obtained by forming a circuit by etching the ten copper plated layers of Comparative Example 1, subsequently forming a tin plated layer on the copper circuit, and performing annealing after the tin plating, and further showing the Kirkendall voids that can be observed at the cross section of the circuit portion and the upper surface of the circuit copper.

Subsequently, this copper layer was etched to form a circuit, and a tin plated layer of approximately 0.3 μm was additionally formed on the copper circuit by dipping it into a tin plating bath of AT-501 manufactured by Nikko Mining & Metals at 50° C. for 3 minutes. After the foregoing tin plating, the copper layer was annealed at 125° C.×10.5 hours, and the cross section was observed. This cross section is similarly a result of performing chemical polishing of dipping the copper layer for 15 seconds in an aqueous solution of $NH_3$: 29%, $H_2O_2$: 1%.

The results are shown in FIG. 11. As shown in FIG. 11, numerous small Kirkendall voids (KV) were confirmed at the upper layer surface of the copper foil and at the interface of each of said layers.

As described above, the number of abundant Kirkendall voids that arise in the ten copper layers (at least at the interface of the ten layers) is so high that peeling occurred between the copper layer and the tin plated layer.

The metal covered polyimide composite, method of producing the composite and apparatus for producing the composite of the present invention can effectively prevent peeling in a non-adhesive flexible laminate (especially a two-layer flexible laminate), particularly can effectively inhibit peeling from the interface of a copper layer and a tin plating, and yield a superior effect of being able to improve the adhesion strength. Thus, the present invention is useful as a non-adhesive flexible laminate that is used as a mounting material of electronic components such as a flexible print substrate, TAB, COF.

We claim:

1. A method of producing a metal covered polyimide composite, comprising the steps of:
    forming a tie-coat layer and a metal seed layer on a surface of a polyimide film by electroless plating or a drying method;
    after said forming step, feeding the polyimide film around a plating drum so as to submerge the polyimide film in an electroplating solution within an electroplating bath;
    during said feeding step, electroplating two or three electroplated layers of copper or copper alloy on the metal seed layer, during said electroplating step, the metal seed layer of the polyimide film functioning as a cathode and a plurality of anodes being arranged to face the plating drum within the electroplating bath and to define a plurality of electroplating zones in which current density is independently controllable;
    electrically connecting two adjacent electroplating zones within the electroplating bath; and
    adjusting a gap between the two adjacent electrically-connected electroplating zones such that the gap is equal to or less than half a distance between anodes of the two adjacent electrically-connected electroplating zones and the polyimide film on the plating drum.

2. The method of producing a metal covered polyimide composite according to claim 1, wherein the plurality of electroplating zones includes two to four zones during said electroplating step.

3. A method according to claim 1, further comprising the steps of:
after said electroplating step, etching the polyimide film to form a copper circuit or copper alloy circuit; and
tin plating the copper circuit or copper alloy circuit.

4. A method according to claim 1, wherein the tie-coat layer is nickel, chromium, cobalt, nickel alloy, chromium alloy, or cobalt alloy, and the metal seed layer is copper or copper alloy.

5. A method according to claim 1, wherein each of the plurality of electroplating zones consists of a single anode.

6. A method of producing a metal covered polyimide composite, comprising the steps of:
forming a tie-coat layer and a metal seed layer on a surface of a polyimide film by electroless plating or a drying method;
after said forming step, feeding the polyimide film onto a first plating drum to submerge the polyimide film within an electroplating solution within a first electroplating bath and subsequently feeding the polyimide film onto a second plating drum to submerge the polyimide film within a second electroplating bath;
during said feeding steps, electroplating two or three electroplated layers of copper or copper alloy on the metal seed layer such that at least one of the two or three electroplated layers of copper or copper alloy is electroplated onto the metal seed layer of the polyimide film in each of the first and second electroplating baths;
during said electroplating step within said first electroplating bath the metal seed layer of the polyimide film functioning as a cathode and a plurality of anodes being arranged to face the first plating drum within the first electroplating bath to define a plurality of electroplating zones in which current density is independently controllable;
electrically connecting two adjacent electroplating zones within the first electroplating bath; and
adjusting a gap between the two adjacent electrically-connected electroplating zones such that the gap is equal to or less than half a distance between anodes of the two adjacent electrically-connected electro electroplating zones and the polyimide film on the first plating drum.

7. A method of producing a metal covered polyimide composite, comprising the steps of
forming a tie-coat layer and a metal seed layer on a surface of a polyimide film by electroless plating or a drying method;
after said forming step, feeding the polyimide film around a plating drum so as to submerge the polyimide film in an electroplating solution within an electroplating bath;
during said feeding step, electroplating only one electroplated layer of copper or copper alloy on the metal seed layer, during said electroplating step, the metal seed layer of the polyimide film functioning as a cathode and a plurality of anodes being arranged to face the plating drum within the electroplating bath to define a plurality of electroplating zones in which current density is independently controllable;
electrically connecting two adjacent electroplating zones within the electroplating bath; and
adjusting a gap between the two adjacent electrically-connected electroplating zones such that the gap is equal to or less than half a distance between anodes of the two adjacent electrically-connected electroplating zones and the polyimide film on the plating drum.

8. A method according to claim 7, wherein the one electroplated layer of copper or copper alloy electroplated on the metal seed layer of the polyimide film during said electroplating step has a thickness of 8.50 μm.

9. A method according to claim 8, wherein each of the plurality of electroplating zones consists of a single anode.

* * * * *

UNITED STATES PATENT AND TRADEMARK OFFICE
CERTIFICATE OF CORRECTION

PATENT NO. : 8,721,864 B2
APPLICATION NO. : 13/365429
DATED : May 13, 2014
INVENTOR(S) : Michiya Kohiki et al.

It is certified that error appears in the above-identified patent and that said Letters Patent is hereby corrected as shown below:

IN THE CLAIMS:

Column 14, line 6 "electro electroplating" should read "electroplating"

Signed and Sealed this
Second Day of December, 2014

Michelle K. Lee
*Deputy Director of the United States Patent and Trademark Office*